(12) United States Patent
Lin et al.

(10) Patent No.: US 11,917,795 B2
(45) Date of Patent: Feb. 27, 2024

(54) HEAT SINK STRUCTURE

(71) Applicant: ASIA VITAL COMPONENTS CO., LTD., New Taipei (TW)

(72) Inventors: Yuan-Yi Lin, New Taipei (TW); Fu-Kuei Chang, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 327 days.

(21) Appl. No.: 17/242,230

(22) Filed: Apr. 27, 2021

(65) Prior Publication Data

US 2022/0346266 A1 Oct. 27, 2022

(51) Int. Cl.
H05K 7/20 (2006.01)

(52) U.S. Cl.
CPC .................. *H05K 7/2039* (2013.01)

(58) Field of Classification Search
CPC ................................................. H05K 7/2039
USPC ............................................... 165/80.4
See application file for complete search history.

(56) References Cited

U.S. PATENT DOCUMENTS

| | | | | |
|---|---|---|---|---|
| 6,401,807 B1* | 6/2002 | Wyler | ................. | H01L 23/467 |
| | | | | 174/16.3 |
| 7,013,960 B2* | 3/2006 | Lee | ................. | H01L 23/427 |
| | | | | 174/15.2 |
| 8,376,032 B2* | 2/2013 | Song | ................. | H01L 23/427 |
| | | | | 165/80.4 |
| 2003/0019610 A1* | 1/2003 | Liu | ................. | F28D 15/00 |
| | | | | 257/E23.102 |
| 2004/0035558 A1* | 2/2004 | Todd | ................. | F28D 15/0275 |
| | | | | 257/E23.102 |
| 2006/0262504 A1* | 11/2006 | Xia | ................. | H01L 23/467 |
| | | | | 257/E23.099 |
| 2009/0126904 A1* | 5/2009 | Lin | ................. | H01L 23/40 |
| | | | | 165/80.2 |
| 2012/0098400 A1* | 4/2012 | Yu | ................. | F21V 29/67 |
| | | | | 313/46 |

FOREIGN PATENT DOCUMENTS

| | | |
|---|---|---|
| CN | 107305876 A | 10/2017 |
| TW | M346263 U | 12/2008 |
| TW | M614782 U | 7/2021 |

OTHER PUBLICATIONS

Search Report dated Jan. 12, 2023 issued by Taiwan Intellectual Property Office for counterpart application No. 110112561, 2 pages.

* cited by examiner

*Primary Examiner* — Claire E Rojohn, III

(74) *Attorney, Agent, or Firm* — Bradley J. Thorson; DeWitt LLP

(57) ABSTRACT

A heat sink structure includes a base seat and at least one heat dissipation unit. The base seat has a first face and a second face. At least one extension column extends from the second face of the base seat. The heat dissipation unit is disposed above the base seat and spaced from the base seat by a gap. The extension column serves to restrict or secure the heat dissipation unit in horizontal and vertical directions. The heat dissipation unit with different structures provides multiple heat dissipation features to enhance the entire heat dissipation performance.

8 Claims, 8 Drawing Sheets

HEAT SINK STRUCTURE

BACKGROUND OF THE INVENTION

1. Field of the Invention

The present invention relates generally to a heat sink structure, and more particularly to a heat sink structure including different kinds of radiating fin assemblies, which are arranged in layers at intervals to enhance heat dissipation effect. The radiating fin assemblies are securely supported without possibility of deformation.

2. Description of the Related Art

A heat sink is a heat dissipation component for increasing heat dissipation area after the heat is conducted. The heat sink includes multiple radiating fins in contact with air for heat exchange. The heat is outward dissipated by way of heat radiation so as to achieve the object of heat dissipation.

Different sizes or different kinds of heat sinks are selectively applied to different heat sources. In the case that the heat source has greater power, a heat sink with a proper area is selectively applied to the heat source in accordance with the size of the space. The existent heat sinks can be classified into two types, one of which is composed of aluminum extrusion radiating fins, while the other of which is composed of stacked radiating fins connected with each other by means of lap joint. The gaps between each two adjacent radiating fins and the heights of the radiating fins of the heat sink are fixed and unified so that the airflow passing through the upper side and lower side of all the radiating fins and the gap between the radiating fins is limited and unified. In this case, when the conventional heat sink contacts and is attached to a heat source (such as a central processing unit or a graphics processing chip) for conducting the heat and the radiating fins of the heat sink outward dissipate the heat by way of radiation, the flow amount of the airflow blowing to the upper and lower sides of the radiating fins is limited and unified. As a result, the heat carried away is limited.

Along with the enhancement of the wattage and performance of the electronic components, the number and the height of the radiating fins of the conventional heat sink must be increased so as to enlarge the heat dissipation area. However, in the limited internal space of the electronic device, the more the number of the radiating fins is, the narrower the gap between the adjacent radiating fins is. (That is, the gap between two adjacent radiating fins will be minified). In this case, the resistance against the airflow flowing through the radiating fins is enlarged and the air volume entering the gap between the radiating fins will be greatly reduced. This will lead to poor heat dissipation efficiency. In the case that the height of the radiating fins is increased, the thickness of the radiating fins is so thin that the radiating fins are apt to deform. In the case that the thickness of the radiating fins is increased, the number of the radiating fins will be reduced. This leads to the problem of decrease of the heat dissipation area.

Therefore, in order to enhance the heat dissipation efficiency, some manufacturers employ two independent heat sinks, which are directly stacked as two layers or assembled by means of lap joint so as to achieve higher heat dissipation efficiency. However, this leads to another problem. One heat sink is directly overlaid on another heat sink to abut against and press the radiating fins thereof. The weight of the upper heat sink overlaid on the lower heat sink will apply a pressure to the radiating fins of the lower heat sink to lead to deformation thereof. Therefore, the problem of structural strength of the radiating fins can be hardly solved.

Furthermore, one single configuration of radiating fins can only provide one single type of heat dissipation performance. Multiple heat sources are relatively disposed at the center of the heat sink. However, the heat sink with one single configuration of radiating fins provides the same heat dissipation area at both the periphery and the center to dissipate and conduct the heat. Moreover, one single configuration of radiating fins has equal intervals between the radiating fins so that the flow lengths of the passing heat dissipation airflow are equal to each other. In this case, the heat dissipation airflow cannot provide more heat dissipation effect for those hotter sections. As a result, the heat is easy to collect and accumulate.

It is therefore tried by the applicant to provide a heat sink structure to solve the problems existing in the conventional heat sink.

SUMMARY OF THE INVENTION

It is therefore a primary object of the present invention to provide a heat sink structure including multiple radiating fin assemblies with various heat dissipation features. The radiating fin assemblies are stacked in layers at intervals to provide multiple heat dissipation effects.

To achieve the above and other objects, the heat sink structure of the present invention includes a base seat and at least one heat dissipation unit.

The base seat has a first face and a second face. At least one extension column extends from the second face of the base seat. The heat dissipation unit is disposed above the base seat and spaced from the base seat by a gap. The extension column serves to secure the heat dissipation unit in horizontal and vertical directions.

The multiple heat dissipation units are stacked in layers at intervals and assembled and supported above the base seat. The at least one extension column serves to restrict or secure the heat dissipation units in horizontal and vertical directions. The heat dissipation units with different structures provide various heat dissipation features to enhance the heat dissipation performance.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
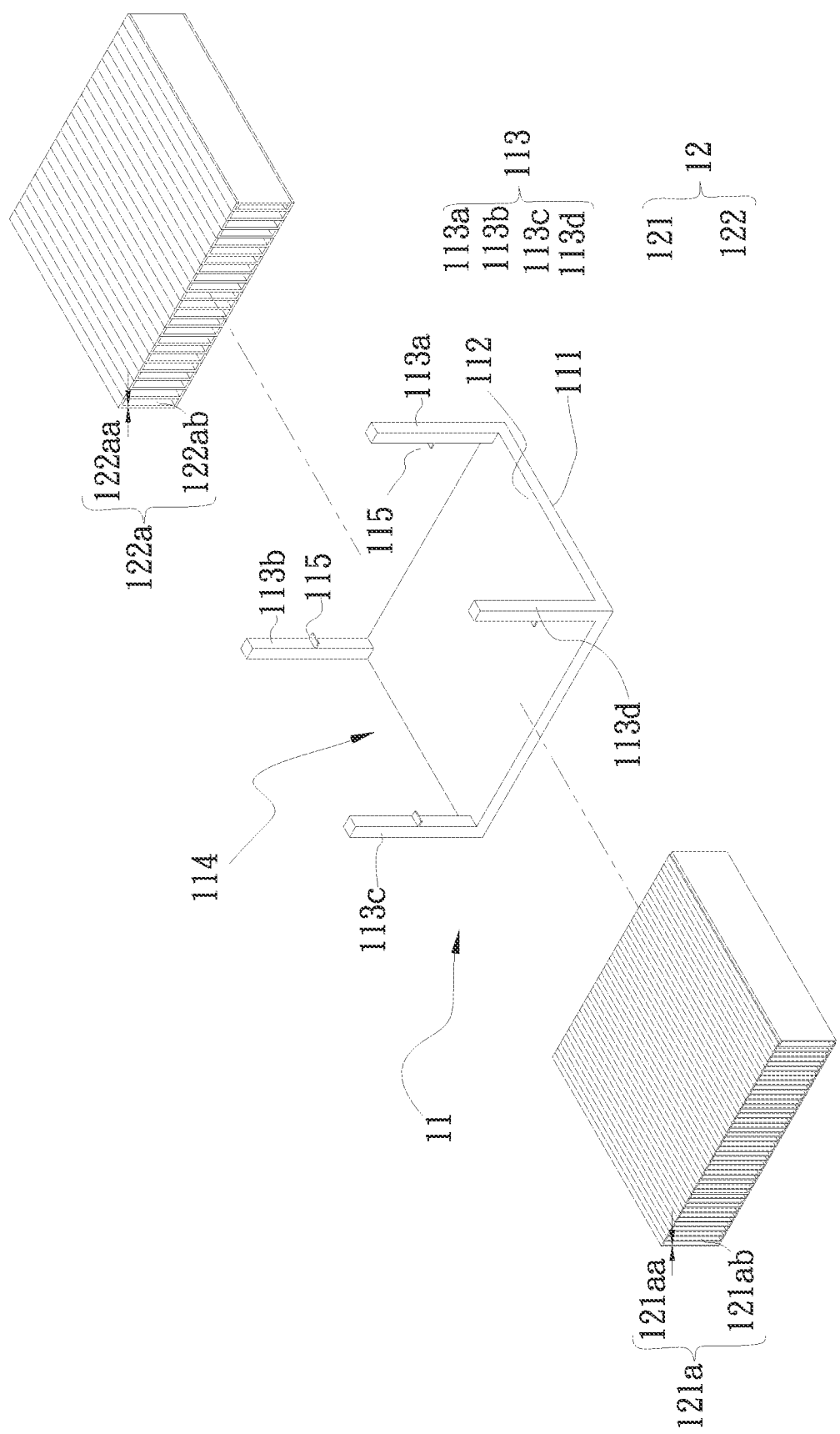
FIG. 1a is a perspective exploded view of a first embodiment of the heat sink structure of the present invention.
Figure 1B:
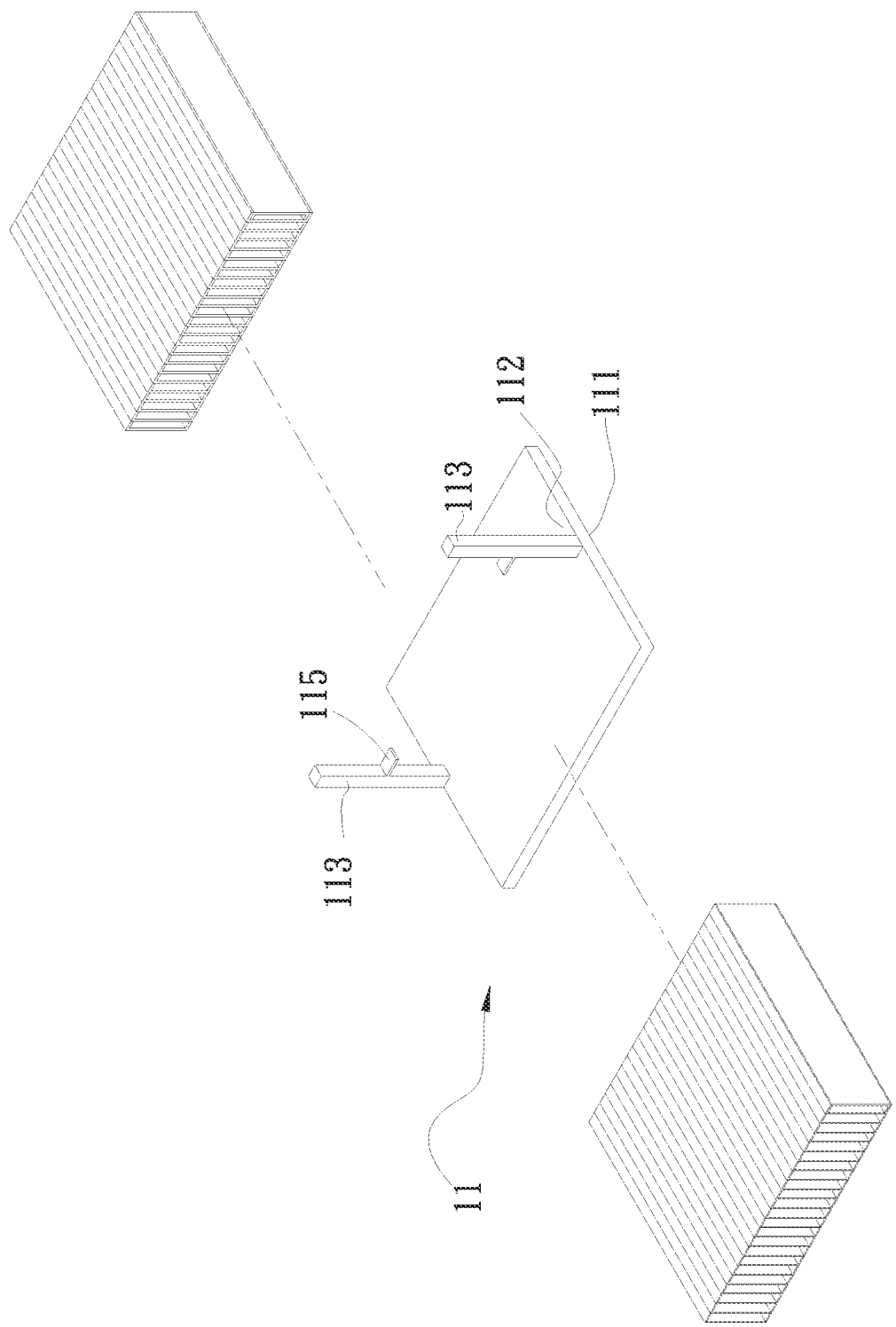
FIG. 1b is another perspective exploded view of the first embodiment of the heat sink structure of the present invention.
Figure 1C:
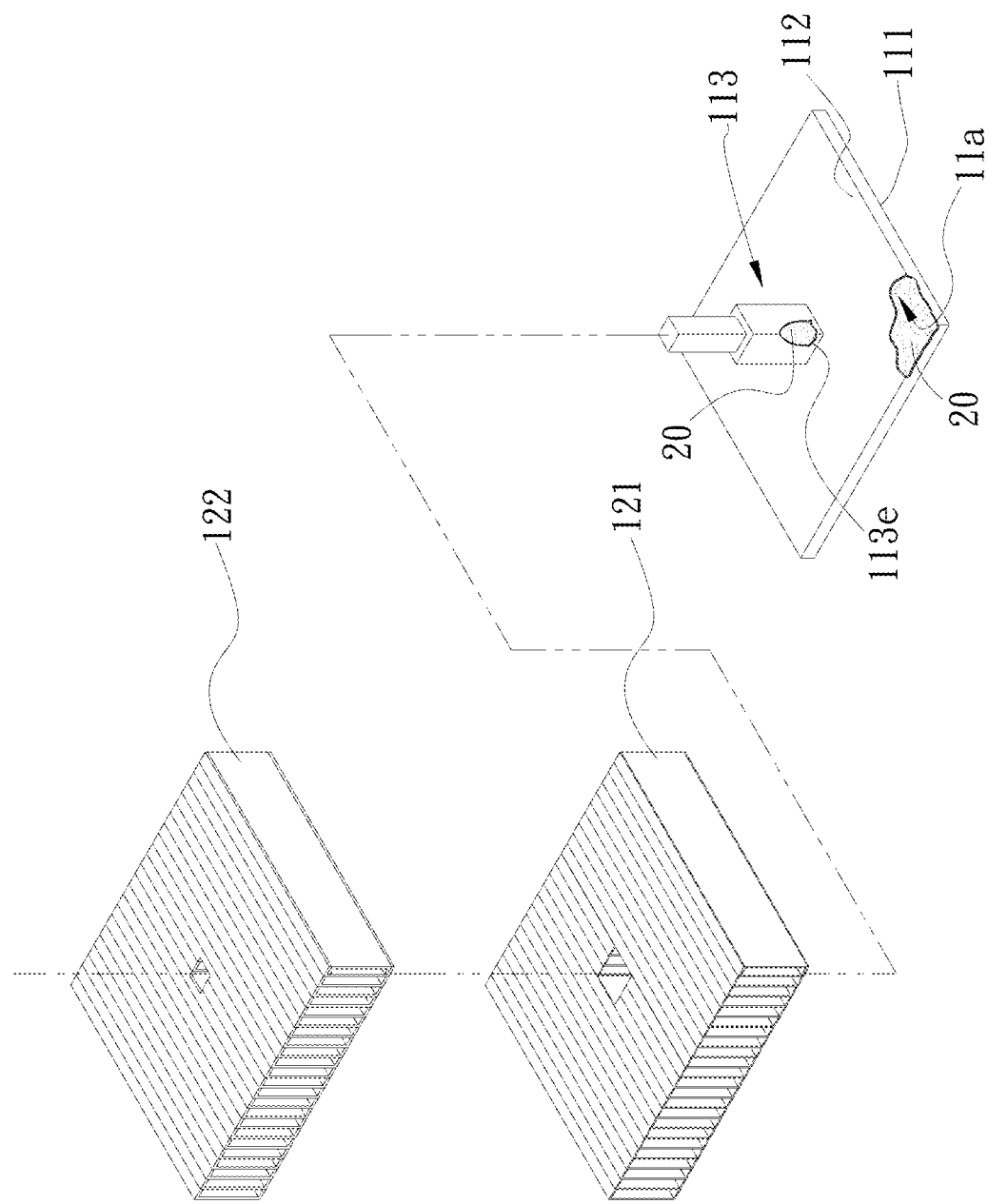
FIG. 1c is still another perspective exploded view of the first embodiment of the heat sink structure of the present invention.
Figure 1D:
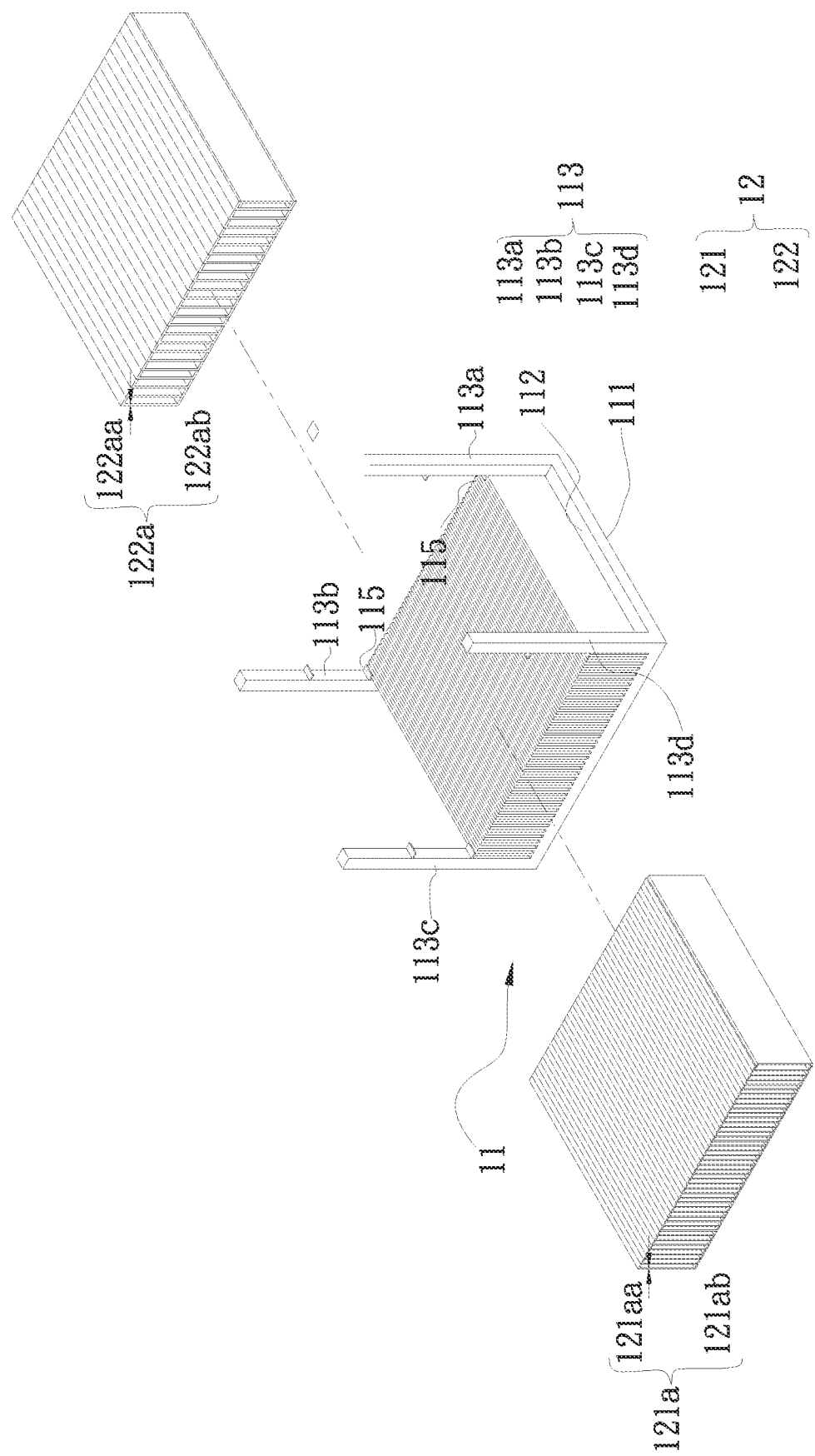
FIG. 1d is still another perspective exploded view of the first embodiment of the heat sink structure of the present invention.
Figure 2:
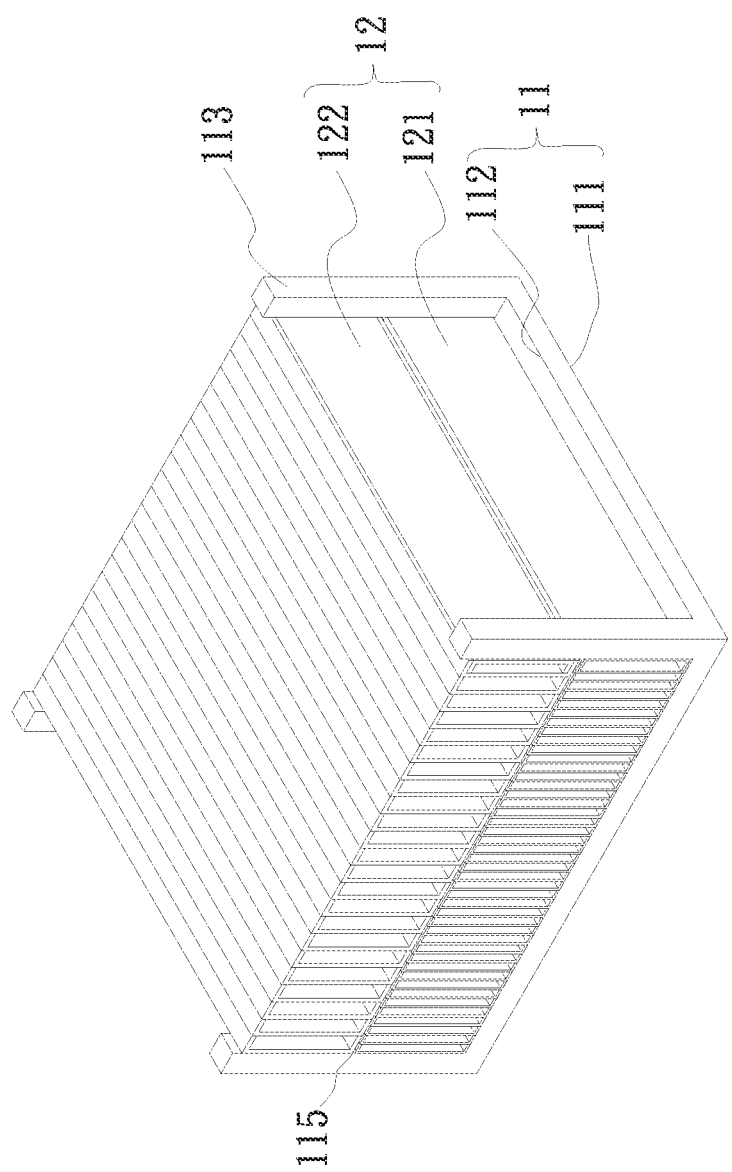
FIG. 2 is a perspective assembled view of the first embodiment of the heat sink structure of the present invention.

Please refer to FIGS. 1a, 1b, 1c, 1d and 2. FIG. 1a is a perspective exploded view of a first embodiment of the heat sink structure of the present invention. FIG. 1b is another perspective exploded view of the first embodiment of the heat sink structure of the present invention. FIG. 1c is still another perspective exploded view of the first embodiment of the heat sink structure of the present invention. FIG. 1d is still another perspective exploded view of the first embodiment of the heat sink structure of the present invention. FIG. 2 is a perspective assembled view of the first embodiment of the heat sink structure of the present invention. As shown in the drawings, the heat sink structure of the present invention includes a base seat 11 and at least one heat dissipation unit 12.

The base seat 11 has a first face 111 and a second face 112. At least one extension column 113 extends from the second face 112 of the base seat 11. The extension column 113 can upward vertically extend from a periphery or fourth corners or a center or any position of the second face 112 of the base seat 11. In this embodiment, there are, but not limited to, multiple extension columns 113 disposed on the second face 112 in pairs. The multiple extension columns 113 include a first extension column 113a, a second extension column 113b, a third extension column 113c and a fourth extension column 113d. In this embodiment, the first, second, third and fourth extension columns 113a, 113b, 113c, 113d are, but not limited to, respectively disposed on four corners of the base seat 11. Alternatively, the extension columns 113 can be only disposed on two sides of the base seat 11 as shown in FIG. 1b. Still alternatively, the extension column 113 can be disposed at the center of the second face 112 as shown in FIG. 1c. The heat dissipation unit 12 is stringed on the extension column 113 to connect with and locate on the base seat 11. In addition, each of the first, second, third and fourth extension columns 113a, 113b, 113c, 113d has a support section 115 formed between an upward extending section of each of the first, second, third and fourth extension columns 113a, 113b, 113c, 113d and the base seat 11. The support sections 115 together define a support space 114. The support sections 115 can independently extend from the first, second, third and fourth extension columns 113a, 113b, 113c, 113d. Alternatively, the support sections 115 can have the form of a vapor chamber normally connected with the first, second, third and fourth extension columns 113a, 113b, 113c, 113d to divide the support space 114 into an upper space and a lower space. Accordingly, the heat dissipation units 12 can be disposed in the support space 114 (the upper and lower spaces) in layers at intervals. A gap exists between the heat dissipation units 12 in vertical direction. Therefore, the flow field of the heat dissipation airflow can be changed to enhance or guide the heat dissipation airflow to more smoothly perform heat exchange with the heat dissipation units 12.

The heat dissipation unit 12 is disposed above the base seat 11 and there is a gap between the heat dissipation units 12 and the base seat 11. The extension columns 113 serve to restrict or secure the heat dissipation unit 12 in horizontal and vertical directions. The heat dissipation unit 12 is a radiating fin assembly composed of multiple radiating fins 121, which are arranged at intervals and connected with each other by means of lap joint or engagement or latching. The radiating fin assembly is disposed in the support space 114. The support sections 115 serve to secure or support the radiating fin assembly.

The support section 115 is formed on the extension column 113 mainly in such a manner that the support section 115 protrudes from the extension column 113 or is recessed into the extension column 113. The primary object is that the corresponding recessed or protrusion sections of the heat dissipation unit 12 can be securely located on the support sections 115. Accordingly, the heat dissipation unit 12 can be relatively secured and located on the base seat 11 in vertical and horizontal directions. Moreover, the extension column 113 can further conduct the heat absorbed by the base seat 11 to the heat dissipation unit 12 for heat conduction use. Vacuumed airtight chambers can be disposed in the interiors of the extension column 113 and the base seat 11 for heat exchange of two-phase fluid. The vacuumed airtight chamber of the extension column 113 can be selectively in communication with the vacuumed airtight chamber of the base seat 11 or not in communication with the vacuumed airtight chamber of the base seat 11. By means of the vacuumed airtight chambers, the heat conduction efficiency between the base seat 11 and the extension columns 113 can be further enhanced to promote the heat conduction performance of the extension columns 113 so as to speed the heat transfer from the extension columns 113 to the heat dissipation unit 12.

In this embodiment, the support section 115 has the form of a protrusion. The protrusion extends from the extension column 113 to the support space 114.

In this embodiment, the heat dissipation unit 12 is composed of a first radiating fin assembly 121 and a second radiating fin assembly 122. The first and second radiating fin assemblies 121, 122 are securely restricted by the extension columns 113 and arranged as an upper layer and a lower layer. The first and second radiating fin assemblies 121, 122 can be arranged as an upper layer and a lower layer and selectively in contact with each other or not in contact with each other. The first radiating fin assembly 121 is composed of multiple first radiating fins 121a. Each first radiating fin 121a has a first thickness 121aa. A first gap 121ab is defined between each two adjacent first radiating fins 121a. The second radiating fin assembly 122 is composed of multiple second radiating fins 122a. Each second radiating fin 122a has a second thickness 122aa. A second gap 122ab is defined between each two adjacent second radiating fins 122a. The first thickness 121aa is larger than or smaller than the second thickness 122aa. The first gap 121ab is larger than or smaller than the second gap 122ab.

The first thickness 121aa and second thickness 122aa of the first and second radiating fin assemblies 121, 122 can be equal to each other. However, the first gap 121ab is larger than the second gap 122ab. In the case that the first gap 121ab is larger than the second gap 122ab, the number of the first radiating fins 121a of the first radiating fin assembly 121 is less so that the first gap 121a is larger, whereby the flow amount of the heat dissipation airflow entering the first gap 121ab is increased. The second gap 122ab is smaller so that the number of the second radiating fins 122a of the second radiating fin assembly 122 is more so as to provide larger heat exchange area. Therefore, no matter whether the gap between the radiating fins is increased to enhance the flow amount of the entering heat dissipation airflow or the gap between the radiating fins is reduced to increase the number of the arranged radiating fins in return so as to increase the heat exchange area, the heat exchange efficiency can be enhanced in both situations. The first and second radiating fin assemblies 121, 122 can provide more than two design combinations. In contrast, both the gap and the number of the radiating fins of the conventional heat sink are fixed without possibility of change. Therefore, the design of the present invention provides more flexible options of arrangement of the radiating fins.

One side of the first radiating fin assembly 121 is plainly attached to one face of the base seat 11. The first radiating fin assembly 121 is securely restricted by the extension columns 113 in horizontal direction, while securely restricted by the support sections 115 in vertical direction. One side of the second radiating fin assembly 122 abuts against the support sections 115 and is securely restricted. The second radiating fin assembly 122 is securely restricted by the extension columns 113 in horizontal direction. The base seat 11 has a heat dissipation section 114 formed in such a manner that the heat dissipation section 114 directly upward extends from the second face 112 of the base seat 11. The heat dissipation section 114 and the first and second radiating fin assemblies 121, 122 are arranged at intervals in layers.

The heat absorbed by the base seat 11 can be directly transferred to the first radiating fin assembly 121 to dissipate the heat. Also, the heat can be transferred through the extension columns 113 to the first and second radiating fin assemblies 121, 122. Alternatively, one end of a heat pipe (not shown) can be passed through the base seat 11 and the other end of the heat pipe is passed through the first and second radiating fin assemblies 121, 122 to enhance the heat dissipation performance.

The first gap 121ab of the first radiating fin assembly 121 is larger than the second gap 122ab so that the first radiating fin assembly 121 has smaller flow resistance. Therefore, the heat dissipation fluid can in priority flow toward the first gap 121ab so as to change the flowing path of the heat dissipation fluid.

Figure 3:
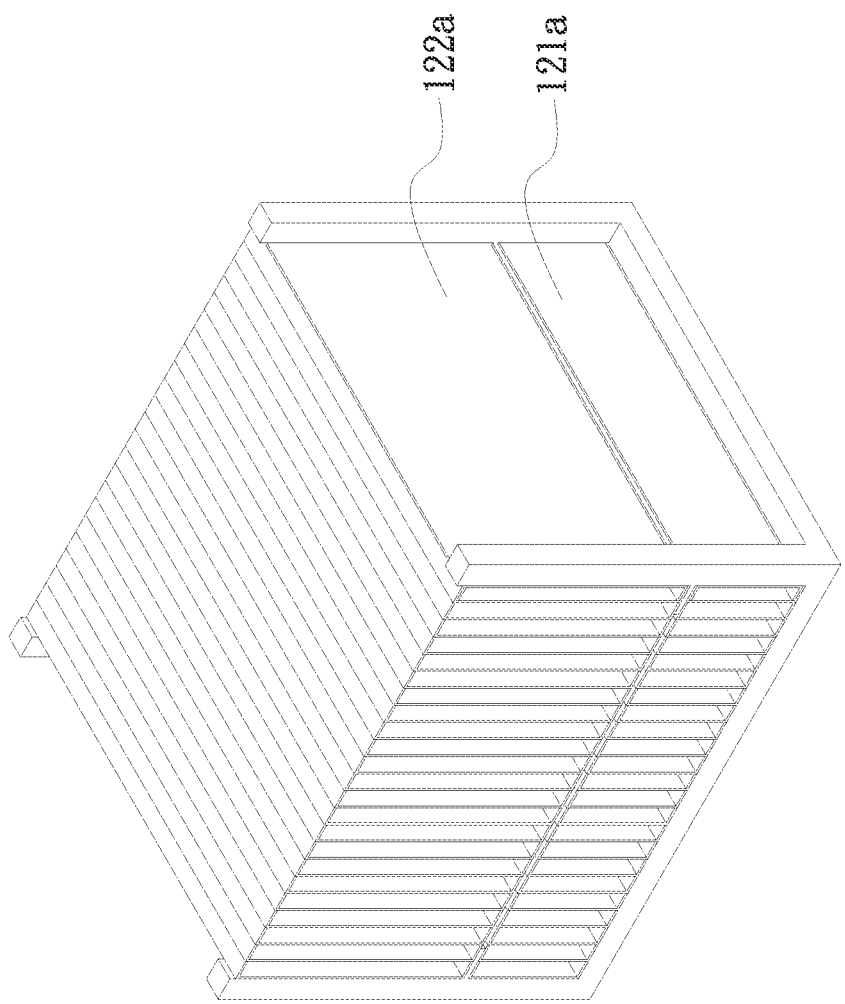
FIG. 3 is a perspective view of a second embodiment of the heat sink structure of the present invention.

Please refer to FIG. 3, which is a perspective view of a second embodiment of the heat sink structure of the present invention. The second embodiment is partially identical to the first embodiment in structure and thus will not be redundantly described hereinafter. The second embodiment is different from the first embodiment in that the first and second radiating fins 121, 122a can selectively have identical configurations or different configurations. In this embodiment, the configurations of the first and second radiating fins 121, 122a are, but not limited to, different from each other.

Figure 4:
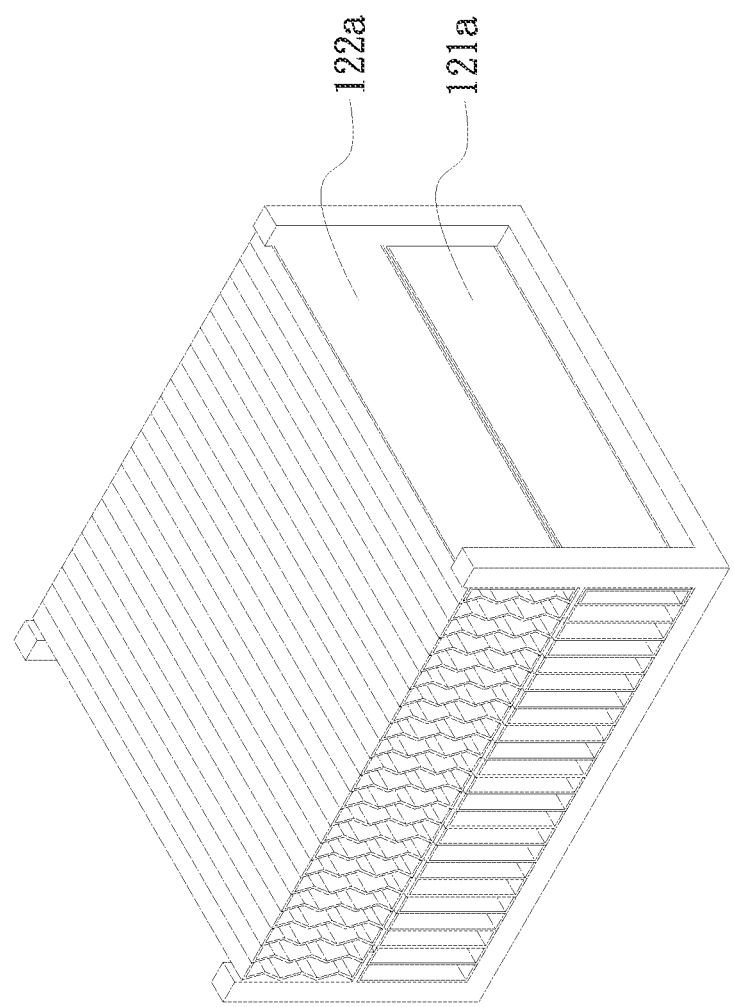
FIG. 4 is a perspective view of a third embodiment of the heat sink structure of the present invention.

Please refer to FIG. 4, which is a perspective view of a third embodiment of the heat sink structure of the present invention. The third embodiment is partially identical to the first embodiment in structure and thus will not be redundantly described hereinafter. The third embodiment is different from the first embodiment in that the first and second radiating fins 121, 122a have equal heights or unequal heights. In this embodiment, the heights of the first and second radiating fins 121, 122a are, but not limited to, equal to each other.

Figure 5:
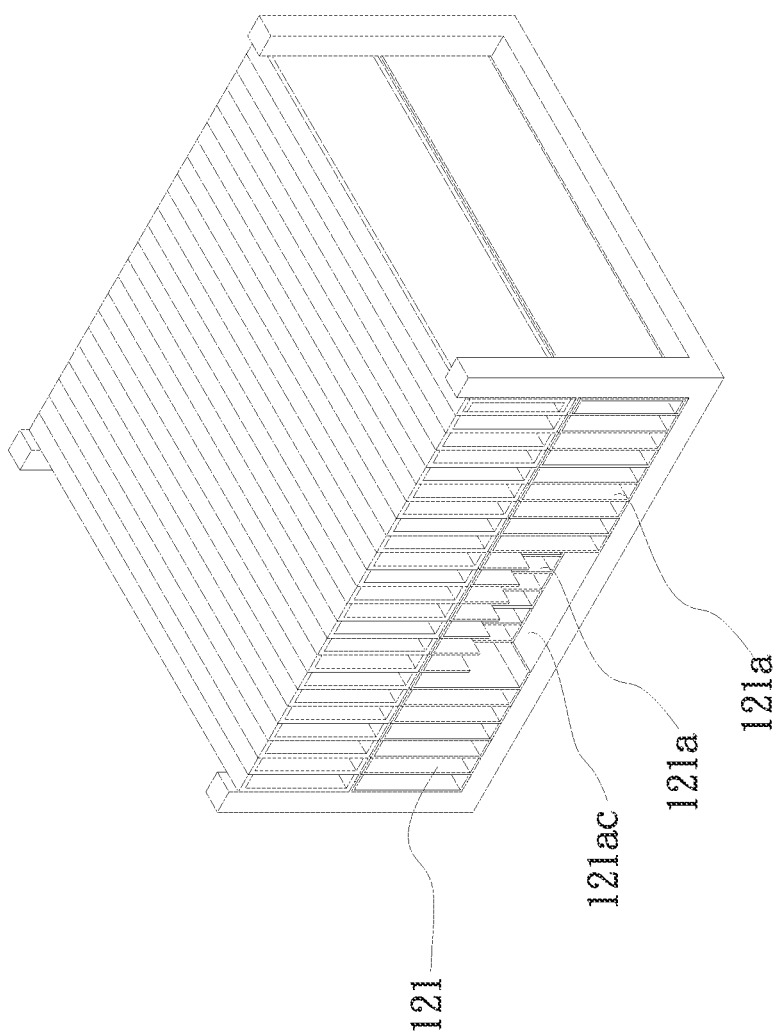
FIG. 5 is a perspective view of a fourth embodiment of the heat sink structure of the present invention.

Please refer to FIG. 5, which is a perspective view of a fourth embodiment of the heat sink structure of the present invention. The fourth embodiment is partially identical to the first embodiment in structure and thus will not be redundantly described hereinafter. The fourth embodiment is different from the first embodiment in that the first radiating fin assembly 121 has at least one first wind guide mouth 121ac. The first wind guide mouth 121ac is disposed on the windward side (the side from which the heat dissipation airflow enters the first radiating fin assembly 121) of the first radiating fin assembly 121. That is, the first wind guide mouth 121ac is inward recessed from the windward side of the first radiating fin assembly 121. The length of the first radiating fins 121a at the first wind guide mouth 121ac is shorter than the length of the other first radiating fins 121a free from the first wind guide mouth 121ac. A passage with shorter flow length is formed at the first wind guide mouth 121ac so that the flow resistance of the passage at the first wind guide mouth 121ac is smaller. In this case, the heat dissipation fluid can be more collected at the first wind guide mouth 121ac to provide better heat exchange efficiency. The first wind guide mouth 121ac can be alternatively disposed on the left side or right side of the windward side of the first radiating fin assembly 121. In this embodiment, the first wind guide mouth 121ac is, but not limited to, disposed at the middle of the windward side of the first radiating fin assembly 121 for illustration purposes.

The present invention employs different features or different configurations of radiating fin assemblies to arrange the radiating fin assemblies at intervals in layers. The radiating fin assemblies are assembled with each other (in direct full contact or partial contact). The different configurations of radiating fins can change the flowing path of the heat dissipation fluid so as to provide different heat exchange efficiencies for different areas. Accordingly, different heat dissipation features can be provided for the heat source to dissipate the heat. Moreover, the heat sinks are arranged at intervals in layers and assembled with each other. Therefore, the shortcoming of the conventional heat sink that the radiating fins are extended for increasing the heat dissipation area of the radiating fins so that the structural strength of the radiating fins is lowered. In addition, the support sections 115 provide supporting and securing effect for the heat sink so that when the heat sinks are overlaid on each other, the radiating fins will not deform as the conventional heat sink. Also, the entire heat dissipation performance is enhanced.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A heat sink structure comprising:
a base seat having a first face and a second face, at least one extension column correspondingly vertically extending from a periphery of four corners of the second face of the base seat, and together defining a support space, a support section located on the at least one extension column and above the base seat and between an upward extending section of the at least one extension column and the base seat to divide the support space into an upper space and a lower space; and
at least one heat dissipation unit composed of multiple radiating fin assemblies, the support section and the base seat respectively serving to secure and support the multiple radiating fin assemblies in the upper space and the lower space, such that the multiple radiating fin assemblies are stacked as an upper layer and a lower layer by means of the support section, a gap existing between the radiating fin assemblies in a vertical direction, and wherein the base seat, the extension column and the support section together restrict or secure the heat dissipation unit in horizontal and vertical directions.

2. The heat sink structure as claimed in claim 1, wherein the heat dissipation unit is a radiating fin assembly composed of multiple radiating fins, which are arranged at intervals and connected with each other by means of lap joint or engagement or latching.

3. The heat sink structure as claimed in claim 1, wherein the at least one extension column includes a first extension column, a second extension column, a third extension column and a fourth extension column, the first, second, third and fourth extension columns being respectively disposed on four corners of the base seat.

4. The heat sink structure as claimed in claim 1, wherein the heat dissipation unit is composed of a first radiating fin assembly and a second radiating fin assembly, the first and second radiating fin assemblies being arranged as an upper layer and a lower layer and secured by the extension columns, the first radiating fin assembly being composed of multiple first radiating fins, each first radiating fin having a first thickness, a first gap being defined between each two adjacent first radiating fins, the second radiating fin assembly being composed of multiple second radiating fins, each second radiating fin having a second thickness, a second gap being defined between each two adjacent second radiating fins, the first thickness being larger than or smaller than the second thickness, the first gap being larger than or smaller than the second gap.

5. The heat sink structure as claimed in claim 4, wherein the first radiating fins have a configuration identical to or different from a configuration of the second radiating fins.

6. The heat sink structure as claimed in claim 4, wherein the first radiating fins have a height equal to or unequal to a height of the second radiating fins.

7. The heat sink structure as claimed in claim 1, wherein vacuumed airtight chambers are disposed in an interior of the base seat and an interior of the extension column for heat exchange of two-phase fluid, the vacuumed airtight chamber of the extension column being selectively in communication with the vacuumed airtight chamber of the base seat or not in communication with the vacuumed airtight chamber of the base seat.

8. The heat sink structure as claimed in claim 1, wherein the base seat has a heat dissipation section, the heat dissipation section being formed in such a manner that the heat dissipation section directly upward extends from the second face of the base seat.

* * * * *